Figure 1:
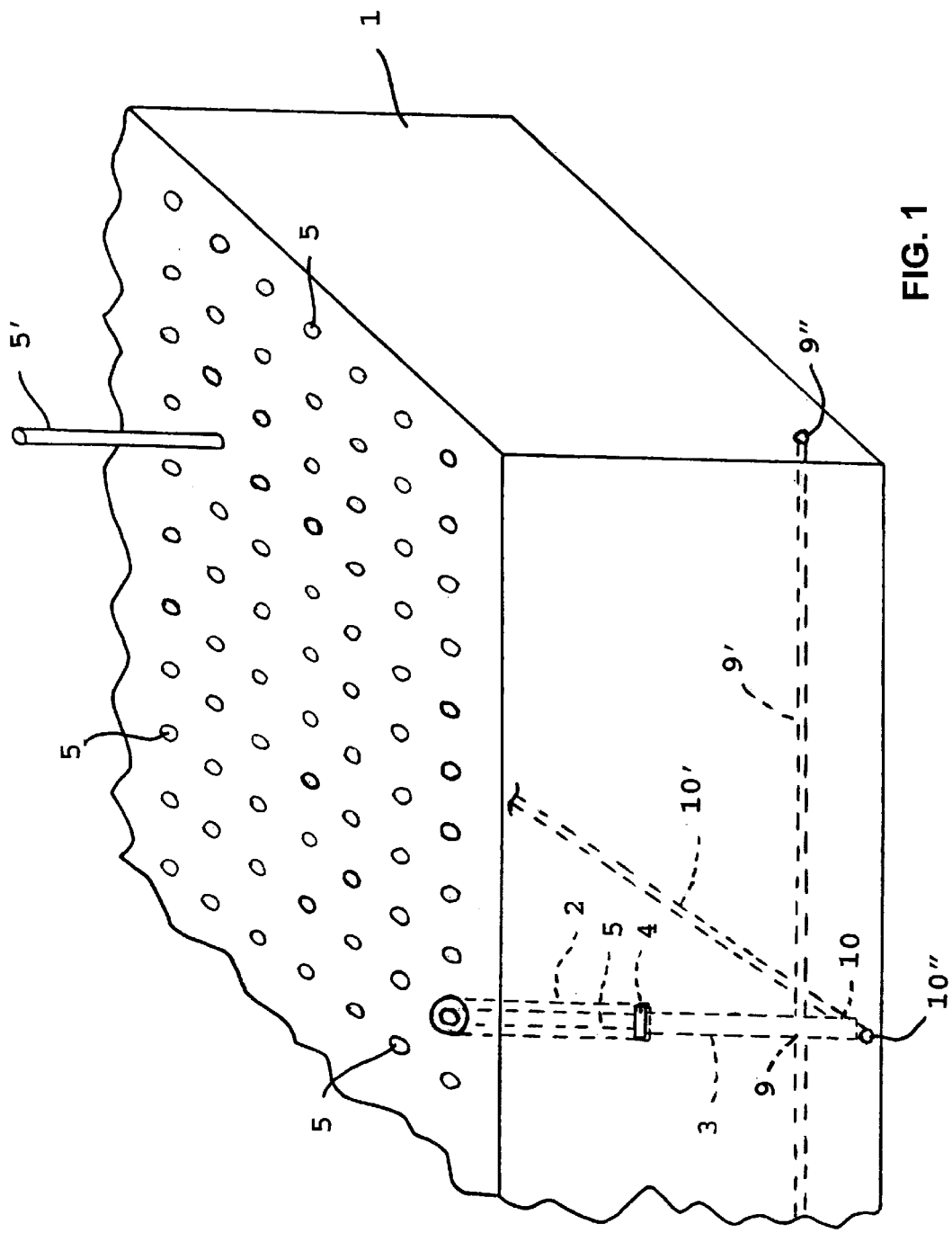

United States Patent [19]
Fox

[11] Patent Number: 6,158,727
[45] Date of Patent: Dec. 12, 2000

[54] SUPPORTING APPARATUS

[75] Inventor: Nigel P Fox, Rugeley, United Kingdom

[73] Assignee: IMI Norgren Limited, Lichfield, United Kingdom

[21] Appl. No.: 09/301,161

[22] Filed: Apr. 28, 1999

[30] Foreign Application Priority Data

Apr. 28, 1998 [GB] United Kingdom .................. 9808998

[51] Int. Cl.⁷ ...................................................... B23Q 3/10
[52] U.S. Cl. ............................ 269/20; 269/266; 269/296
[58] Field of Search .............................. 269/20, 21, 266, 269/267, 289 R, 329, 296; 409/219

[56] References Cited

U.S. PATENT DOCUMENTS

| | | |
|---|---|---|
| 5,157,438 | 10/1992 | Beale . |
| 5,372,357 | 12/1994 | Blaimschein ............................ 269/21 |
| 5,562,276 | 10/1996 | Blick .................................... 269/20 |
| 5,722,646 | 3/1998 | Soderberg et al. ..................... 269/266 |

FOREIGN PATENT DOCUMENTS

| | | |
|---|---|---|
| 0 499 386 A2 | 8/1992 | European Pat. Off. . |
| 2 322 089 | 8/1998 | United Kingdom . |
| WO 95/03901 | 2/1995 | WIPO . |

*Primary Examiner*—Robert C. Watson
*Attorney, Agent, or Firm*—Pillsbury Madison & Sutro LLP

[57] ABSTRACT

A pin table for supporting a workpiece, such as a printed circuit board, while an operation is carried out on it, comprises a base defining a plurality of vertically disposed pneumatic cylinders arranged in a column and row matrix. Each cylinder has a two-position spool valve located axially beneath it in the base for controlling actuation of the cylinder between a position in which the piston rod is fully retracted and a position in which the piston rod is fully raised. The piston rods constitute the pins of the pin table and are selectively movable into their raised positions by the application of compressed air to the cylinders via the spool valves whereby a desired array of raised piston rods may be established.

11 Claims, 3 Drawing Sheets

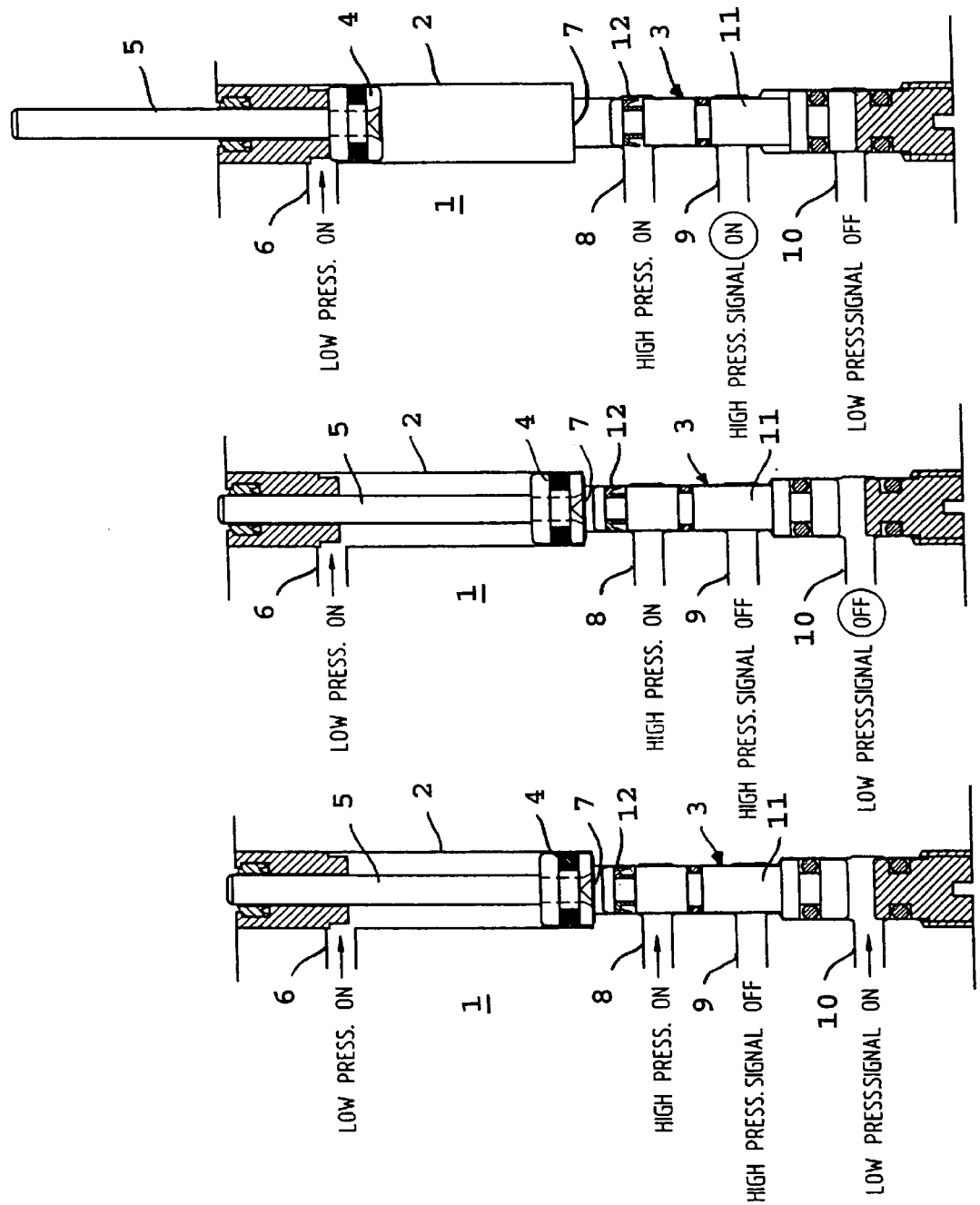

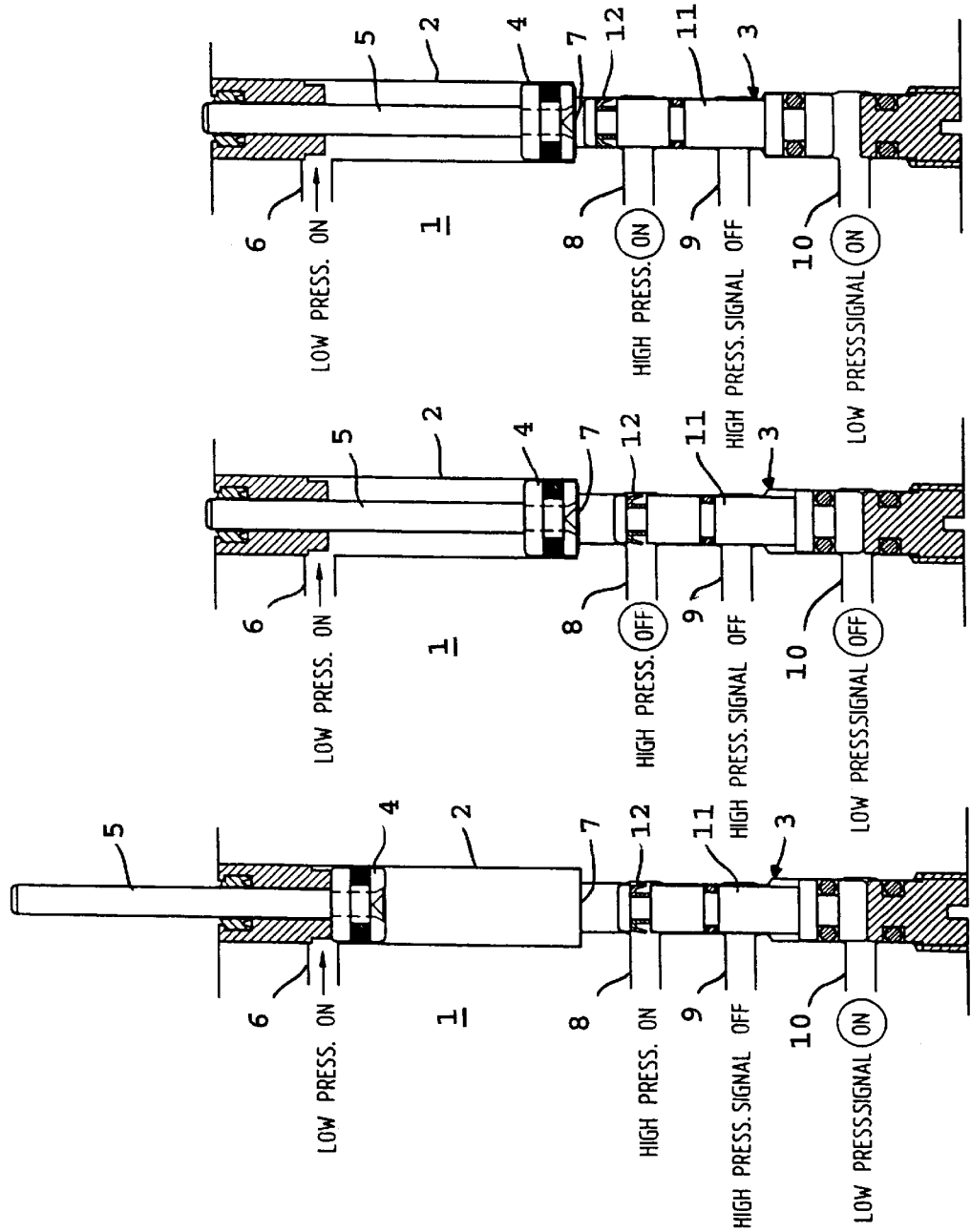

SUPPORTING APPARATUS

SUPPORTING APPARATUS

This invention relates to supporting apparatus and more particularly to so-called "pin tables" which are used for securely supporting a workpiece, especially, but not exclusively, a printed circuit board whilst an operation, such as screen printing or solder paste application, is carried out on it.

U.S. Pat. No. 5,157,438 and European patent application No. 92300807.2, published as No. 0499386 A2, for example, disclose such a pin table. The pin table comprises, as essential features, an array of, typically several hundred, elongate members (or "pins") mounted on a base and which are selectively and independently movable relative to the base between lowered and raised positions. Thus, the printed circuit board or other workpiece may be supported, by selectively raised pins, at several pre-determined locations to prevent it distorting under the force applied to it during the operation. Hereinafter, a pin table having such essential features is referred to as "a supporting apparatus of the type described".

Hitherto, and as is described in the aforementioned documents, relatively complex arrangements have been used to move the selected pins into, and maintain them in, their raised position. The reader is referred, in particular, to the above documents for details of such arrangements.

It is an object of the present invention to provide an improved supporting apparatus of the type described including, in particular, simpler means for selectively actuating the pins and holding them in their raised positions.

According to the present invention in its broadest aspect, there is provided a supporting apparatus of the type described, characterised in that each pin is constituted by a piston rod (or an axial extension thereto and hereinafter referred to collectively as a "piston rod") of a fluid-powered cylinder and in that the pin is movable into its raised position by the application of pressurised actuating fluid to the cylinder.

The fluid-powered cylinder is preferably a pneumatic cylinder actuated by compressed air. However, it is to be understood that the cylinder could, for example, be hydraulically actuated.

Preferably, each cylinder has valve means, such as a spool valve, integrated with it which is selectively operable, on the one hand, to move the piston rod into, and maintain it in, its raised position and, on the other hand, to permit the piston rod to return to its retracted (ie. its lowered) position.

Thus, a supporting apparatus of the invention will comprise an array of cylinders each of which is independently and selectively operable in order to provide the desired array of raised pins for supporting a workpiece during an operation on it. The cylinders may be discrete, conventional cylinders secured together by suitable means. Preferably, however, the cylinders are defined in a single block, or in a number of blocks secured together, and the respective valve means are integrated into the block(s) as are the necessary pressurised fluid supply and exhaust passageways.

In a preferred embodiment of the invention, each valve means is operable to supply pressurised fluid to its associated cylinder, thereby to raise the piston rod, only upon the application of two control signals, preferably fluid control signals, thereto in the nature of an AND gate.

The advantage of this, together with other preferred features of a supporting apparatus of the invention, will now be described in detail, by way of example only, with reference to the accompanying drawings in which:

FIG. 1 is a perspective schematic view of part of a supporting apparatus in accordance with the invention; and FIGS. 2a to 2f are sectional side elevations illustrating the different steps involved in actuation of the cylinders/spool valves of the apparatus shown in FIG. 1.

Referring first to FIG. 1, the apparatus comprises a unitary base 1 which defines a multiplicity of, say 960 (although there could be any desired number) vertical bores each of which comprises an upper, double-acting pneumatic cylinder and a lower spool valve. For the sake of clarity, only one of the vertical bores is indicated (in dashed lines), the upper cylinder being designated 2 and the lower spool valve 3. The cylinder 2 has a piston 4 slidably mounted in it, to which is connected a piston rod 5. The piston rod 5 (as are most of the other piston rods) is shown in its retracted, or lower, position, whereas one, designated 5' is shown in its raised, or upper, position.

FIGS. 2a to 2f show, in more detail, by way of detailed sectional side elevations, the cylinder 2 and the spool valve 3 of FIG. 1. FIGS. 2a to 2d illustrate the sequence of compressed air signals applied to the spool valve 3 in order selectively to raise the piston rod 5 from its retracted (or lower) position into its raised (or upper) position, whereas FIGS. 2e and 2f illustrate the reverse process, ie. retraction of the piston rod 5 from its upper to its lower position.

As can be seen from the legends in FIGS. 2a to 2f, the upper end of the cylinder 2 has an upper compressed air inlet 6 to which relatively low pressure compressed air is constantly fed. This low pressure compressed air serves to bias the piston 4 into its retracted position, but this could equally be effected, in known manner, by using a compression spring instead of air pressure.

The cylinder 2 also has a lower compressed air inlet 7 to which, as will be described later, relatively high pressure compressed air is fed via a compressed air inlet 8 of the spool valve 3 when it is desired to raise the piston rod 5 into its raised position.

The spool valve 3 is actuated, again as will be described later, by two sequentially applied compressed air signals, one of which, namely a high pressure signal, is applicable through an inlet 9 of the spool valve 3 and the other of which, namely a low pressure signal, is applicable through an inlet 10 of the spool valve 3.

The spool valve 3 includes an axially moveable spool 11 which assumes one or other of two axial positions in dependence upon the aforesaid compressed air signals applied to the spool valve 3, as will now be described.

Referring first to FIG. 2a, designated "PRE-SELECT", it will be seen that low pressure compressed air is applied to the inlet 6 (LOW PRESS. ON) and that high pressure compressed air is applied to the inlet 8 (HIGH PRESS. ON). The high pressure signal at inlet 9 is "off" (HIGH PRESS. SIGNAL OFF) whereas the low pressure signal at inlet 10 is "on" (LOW PRESS. SIGNAL ON). Accordingly, and as is shown in FIG. 2a, the spool 11 is biased into its uppermost position, whereby the supply of high pressure compressed air through the inlet 8 to the inlet 7 of the cylinder 2 is prevented by a seal 12 mounted on the spool, and the supply of low pressure compressed air through the inlet 6 biases the piston 4, and hence the piston rod 5, into its lowermost position.

Referring now to FIG. 2b, the low pressure signal applied to the inlet 10 is first discontinued (LOW PRESS. OFF), thereby representing the "application" of a first (negative) actuating signal for the spool valve 3. The application of this first actuating signal alone will not, however result in any change of the position of the spool 11. FIG. 2c shows application of the second actuating signal to the spool valve 3, namely application of the high pressure signal to the inlet 9 (HIGH PRESS. SIGNAL ON). The application of this high pressure signal causes downward movement of the spool 11, as is shown in FIG. 2c, whereby high pressure compressed air applied at the inlet 8 by-passes the seal 12 and communicates with the lower inlet 7 of the cylinder 2. There will, therefore, be a net upward force acting on the piston 4 which, therefore, moves to its uppermost position and so moves the piston rod 5 into its raised position (cf the piston rod 5' shown in FIG. 1).

It can, therefore, be seen that, in order to raise the piston rod 5, it is necessary to apply two pressure signals, or in other words an AND command, to the spool valve 3. This arrangement facilitates the arrangement of the various fluid supply passageways in the base 1 whilst making it possible to produce any desired array of raised piston rods 5.

More particularly, and reverting to FIG. 1, it will be appreciated that each piston rod 5/cylinder 2/spool valve 3 occupies a unique position in the base 1 which can be defined by a row and column coordinate. Accordingly, for example, a common fluid flow passageway could be formed in the base 1 interconnecting the respective inlets 9 of all of the spool valves 3 in a given row, there being such a common passageway for each row. The respective fluid flow passageways would, when required, convey the high pressure signal to each spool valve in a row. Likewise, respective common passageways could be formed in the base 1 interconnecting the respective inlets 10 of all of the spool valves in a given column, there being such a common passageway for each column. FIG. 1 illustrates one of the common passageways, designated 9', interconnecting the inlets 9 of all of the spool valves 3 in a given row, and which has a supply port 9" formed on a face of the base 1. It also illustrates one of the common passageways, designated 10', interconnecting the inlets 10 of all of the spool valves 3 in a given column, and which has a supply port 10" formed on a face of the base 1. With this arrangement, it will be appreciated that selected piston rods 5 may be brought into a raised position by sequentially applying the first and second signals referred to above with reference to FIGS. 2b and 2c to the appropriate row and column passageways. For example, in order to raise just the piston rod 5 associated with the cylinder 2/valve 3 shown in FIG. 1, the first and second signals would be applied sequentially via the port 9"/passageway 9'and the port 10"/passageway 10' respectively, and so on. The application of the signals would be controlled by conventional directional control valves operated in a proper sequence by, for example, a programmable logic controller whereby the desired array of raised pistons 5 may be established.

Likewise, the base 1 may be formed with common fluid flow passageways for supplying the low and high pressure compressed air respectively to each cylinder 2, again through appropriate directional control valves.

Referring now to FIG. 2d, once the piston rod 5 is in its raised position, the high pressure signal at inlet 9 is removed, and the low pressure signal at inlet 10 re-instated. However, with the high pressure air supply still present at inlet 8, the piston rod 5 will be maintained in its raised position.

FIG. 2e illustrates the steps required to retract each piston rod 5, for example where it is desired subsequently to establish a different array of raised piston rods. Thus, the high pressure air supply to the inlet 8 is removed and the inlet 8 connected to exhaust, and the low pressure signal to inlet 10 is also removed. The piston 4, together with its piston rod 5, will therefore move into its retracted position under the influence of the low pressure compressed air supplied to the inlet 6. In order to establish a new array of raised piston rods 5, the various compressed air supplies and signals are reverted to the "pre-select" states shown in FIG. 2f (which of course is the same as FIG. 2a) and then the steps described with reference to FIGS. 2a and 2d may be repeated in the appropriate manner.

What is claimed is:

1. A pin table for supporting a workpiece while an operation is carried out on the workpiece, the table comprising an array of vertically disposed elongate pins mounted in a base, each of the pins being selectively and independently movable relative to the base between a lowered and a raised position whereby the workpiece may be supported, by selectively raised pins, at several predetermined locations to prevent it distorting under force applied to it during the aforesaid operation, each said pin being constituted by a piston rod of a fluid-powered cylinder and being movable into its raised position by the selective application of pressurised actuating fluid to the fluid-powered cylinder via control valve means, said control valve means being operable to permit the supply of said pressurised actuating fluid to said cylinder, thereby to raise its piston rod, only in response to variation of two control signals applied to said control valve means.

2. A pin table according to claim 1 wherein the base comprises a plurality of discrete, vertically disposed fluid-powered cylinders secured together.

3. A pin table according to claim 1 wherein the base comprises a single block defining said plurality of fluid-powered cylinders.

4. A pin table according to claim 1 wherein the base comprises a plurality of blocks secured together, each block defining a plurality of fluid-powered cylinders.

5. A pin table according to claim 1 wherein said control valve means is integrated with its fluid-powered cylinder for controlling extension and retraction of its piston rod between its raised and lowered positions.

6. A pin table according to claim 1 wherein said control valve means comprises a spool valve located in the base below, and axially aligned with, the fluid-powered cylinder that it controls.

7. A pin table according to claim 6 wherein the plurality of fluid-powered cylinders/spool valves are arranged in a plurality of rows and a plurality of columns and wherein one of said control signals is simultaneously applicable to all of the spool valves in a particular row and the other control signal is simultaneously applicable to all of the spool valves in a particular column whereby a cylinder common to a particular row and column is operable in response to said variation of the two control signals.

8. A pin table according to claim 7 wherein the control signals are applied through respective fluid flow passageways in the base interconnecting all of the spool valves in, respectively, a row and a column.

9. A pin table according to claim 8 wherein the base further comprises a plurality of interconnected fluid flow passageways for conveying pressurised actuating fluid to all of the cylinders via their respective spool valves.

10. A pin table according to claim 1 wherein said two control signals are fluid pressure signals, the pressure value of one of which is reduced, and the pressure value of the other of which is increased, in order to cause said control valve means to permit the supply of said pressurised actuating fluid to said cylinder.

11. A pin table for supporting a workpiece while an operation is carried out on the workpiece, the table comprising an array of vertically disposed elongate pins mounted in a base, each of the pins being selectively and independently movable relative to the base between a lowered and a raised position whereby the workpiece may be supported, by selectively raised pins, at several predetermined locations to prevent it distorting under force applied to it during the aforesaid operation, said pins being constituted by the respective piston rods of a plurality of fluid-powered cylinders and being movable into their raised positions by the selective application of pressurised actuating fluid to the fluid-powered cylinders via control valve means, and wherein the base comprises a plurality of blocks secured together, each block defining a single block defining said plurality of fluid-powered cylinders.

* * * * *